United States Patent
Dinur et al.

(10) Patent No.: US 9,991,913 B1
(45) Date of Patent: Jun. 5, 2018

(54) DISCRETE LEVELS ENVELOPE TRACKING

(71) Applicant: Intel IP Corporation, Santa Clara, CA (US)

(72) Inventors: Nati Dinur, Haifa (IL); Uri Perlmutter, Holon (IL); Michael Kerner, Tel Mond (IL)

(73) Assignee: Intel IP Corporation, Santa Clara, CA (US)

( * ) Notice: Subject to any disclaimer, the term of this patent is extended or adjusted under 35 U.S.C. 154(b) by 0 days. days.

(21) Appl. No.: 15/371,768

(22) Filed: Dec. 7, 2016

(51) Int. Cl.
*H04B 1/04* (2006.01)
*H04L 27/26* (2006.01)
*H04L 27/32* (2006.01)

(52) U.S. Cl.
CPC ....... *H04B 1/0475* (2013.01); *H04L 27/2628* (2013.01); *H04L 27/32* (2013.01); *H04B 2001/0408* (2013.01)

(58) Field of Classification Search
CPC .... H04B 1/0475; H04L 27/2628; H04L 27/32
USPC ...................................... 455/127.1
See application file for complete search history.

(56) References Cited

U.S. PATENT DOCUMENTS

| | | | |
|---|---|---|---|
| 6,788,151 B2 * | 9/2004 | Shvarts | H03F 1/025 330/127 |
| 7,440,733 B2 | 10/2008 | Maslennikov et al. | |
| 7,715,811 B2 | 5/2010 | Kenington | |
| 2012/0235737 A1 | 9/2012 | Reisner et al. | |
| 2014/0085008 A1 * | 3/2014 | Cohen | H03F 1/0227 330/297 |
| 2014/0132354 A1 | 5/2014 | Briffa et al. | |
| 2017/0373644 A1 | 12/2017 | Gatard et al. | |

OTHER PUBLICATIONS

Partial European Search Report dated Apr. 10, 2018 for European Patent Application 17200224.8.

* cited by examiner

*Primary Examiner* — Sanh Phu
(74) *Attorney, Agent, or Firm* — Eschweiler & Potashnik, LLC

(57) ABSTRACT

An envelope tracking arrangement is disclosed and includes a level select component, a chunk supply component and a power amplifier. The level select component is configured to segment an input signal into chunks based on time and to select a chunk level for each chunk based on information or envelope information. The chunk supply component is configured to selectively provide a discrete supply voltage according to the selected chunk level. The power amplifier is configured to generate a radio frequency (RF) output signal based on the input signal and utilizing the discrete supply voltage.

6 Claims, 6 Drawing Sheets

DISCRETE LEVELS ENVELOPE TRACKING

BACKGROUND

A fixed supply radio frequency (RF) power amplifier (PA) operates with a fixed supply voltage and amplifies an input or transmit signal for RF transmission. The fixed supply PA may operate efficiently for higher valued signals. However, the fixed supply PA typically operates inefficiently at lower values.

Furthermore, the fixed supply PA may be efficient for higher input values or ranges, but these high values can lead to compression and introduce nonlinearities into an amplified output signal. Thus, when the fixed supply PA can operate more efficiently, nonlinearities are introduced into its output.

Envelope tracking is an alternative approach that utilizes a non-fixed supply PA. Envelope tracking may provide more power efficiency at lower signal levels as compared with fixed supply PAs. However, envelope tracking across large channel widths and/or certain frequencies can be problematic.

DETAILED DESCRIPTION

Figure 1:
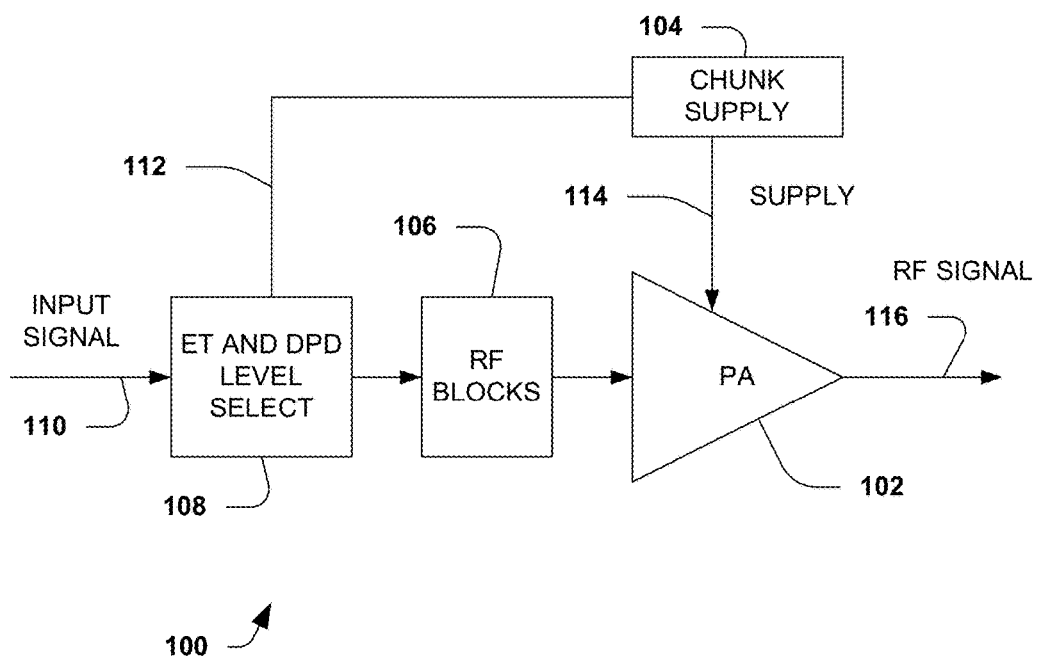
FIG. 1 is a diagram illustrating a level based envelope tracking (ET) power amplifier (PA) arrangement.

The systems and methods of this disclosure are described with reference to the attached drawing figures, wherein like reference numerals are used to refer to like elements throughout, and wherein the illustrated structures and devices are not necessarily drawn to scale.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC, an electronic circuit and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Envelope tracking (ET) is an approach to radio frequency (RF) power amplifier (PA) design in which a power supply voltage applied to a PA is adjusted to enhance or improve power efficiency during a transmission. Thus, the power efficiency of ET power amplifiers is improved compared to fixed supply power amplifiers. ET can be utilized in RF front ends for communication systems to perform amplitude modulation (AM).

Typically, ET determines instantaneous amplitude information for an input signal. This instantaneous amplitude information is referred to as an envelope or envelope tracking information. The envelope information is then used to adjust a supply voltage to a PA. Thus, the supply voltage tracks the envelope of the input signal and efficiency of the PA is facilitated.

ET does facilitate PA efficiency for applications such as amplitude modulation. However, ET is limited by channel width. For example, ET tracking the amplitude becomes increasingly more difficult as channel widths increases, particularly with channels wider than 20-40 mega Hertz (MHz). As a result, the above approaches to ET may not be suitable for some applications that use other frequencies and/or channel widths.

Embodiments disclosed here utilize enhanced levels envelope tracking (ET). The enhanced ET incorporates two or more non-causal levels based envelope tracking. The two or more levels are supply voltages or voltage levels and are used with the PA and for digital pre-distortion (DPD). As a result, wider channels are supported including, but not limited to, WiFi 802.11ac (channels up to 160 MHz), Long Term Evolution (LTE) Advanced (channels up to 100 MHz), ultra wideband applications, and the like.

FIG. 1 is a diagram illustrating a level based envelope tracking (ET) power amplifier (PA) arrangement 100. The arrangement 100 utilizes enhanced levels envelope tracking (ET). The enhanced ET uses two or more levels or discrete levels for ET and digital pre-distortion (DPD).

The arrangement 100 includes a power amplifier (PA) 102, a chunk supply 104, radio frequency (RF) blocks 106 and an ET and DPD level select component 108 or ET and DPD component 108. The arrangement 100 can be used with and/or part of a transmission (TX) chain.

The ET and DPD component 108 receives a baseband signal or input signal 110 and provides a pre-distorted signal to RF blocks 106. The ET and DPD component 108 is configured to segment the signal 110 into chunks based on time. The chunk time can be, for example, 20-4000 nanoseconds (ns), in one example. An orthogonality time of OFDM in WiFi is 3200 ns and 4000 ns is a symbol duration, including a guard interval (GI). Other chunk times are contemplated.

The component 108 is also configured to determine or select a chunk level for each chunk, where the chunk level is one of two or more possible levels of supply voltage (e.g., 1.5 volts, 3 volts and the like) or VCC levels. The chunk level is determined based on the input signal 110, an allowed distortion and a selected reduced power consumption. In one example, the chunk level is based on envelope tracking information of the input signal 110. In another example, the chunk level is determined according to an actual signal peak value for the chunk, where the envelope tracking information includes the actual signal peak value. Other suitable techniques can be used to determine the chunk levels. The chunk levels are provided as a chunk level signal 112.

The component 108 is further configured to set a duration or switching time for switching the power supply 104 from one level to another. The supply 104 may require a period of time to switch from one voltage level to another. The component 108 sets the switching time based on this required switching time and other factors. The other factors can include symbols, symbol length, amplitude variations and the like of the input signal 110.

The component 108 is also configured to generate pre-distortions for each chunk based on the determined chunk level and to apply the pre-distortions to each chunk of the input signal 110.

The RF block 106 is shown after the component 108 for simplicity, however it is appreciated that the RF blocks 106 can be located before and after the component 108. The RF blocks include, for example, a baseband processor, digital to analog converter (DAC), an IQ mixer and the like. Alternately, the RF blocks 106 can include a polar modulator instead of the IQ mixer.

The input signal 110 can represent information with a modulation based on amplitude, phase, frequency and/or combinations thereof.

The RF block 106 is configured to generate an RF signal based on the input signal 110 and provide the generated RF signal to the PA 102.

The ET supply 104 is configured to selectively apply a supply voltage 114 to the PA 102. The supply voltage is applied at a chunk level associated with a chunk of the RF signal. The PA 102 operates at a mode according to or associated with the chunk level for the RF signal chunk.

Thus, the ET component 108 is configured to supply chunk levels as the supply voltage for a plurality of chunks to the ET supply 104. The ET supply 104 can be configured to apply a path delay so that the correct chunk level is applied to the RF signal. In one example, the path delay correlates to a path delay from the ET component to an input of the PA 102.

The PA 102 operates in a mode based on the chunk level and is configured to generate an output RF signal 116 based on the input signal or RF signal from the RF block 106. The PA 102 is powered by the supply voltage from the chunk supply 104.

The RF signal 116 can be transmitted using one or more antenna, which are not shown.

The arrangement 100 and the generated RF signal 116 can be generated for wide channels, including channels wider than 20-40 MHz. The wide channels can also include WiFi 802.11ac (channels up to 160 MHz), Long Term Evolution (LTE) Advanced (channels up to 100 MHz), ultra wideband applications, and the like.

Figure 2:
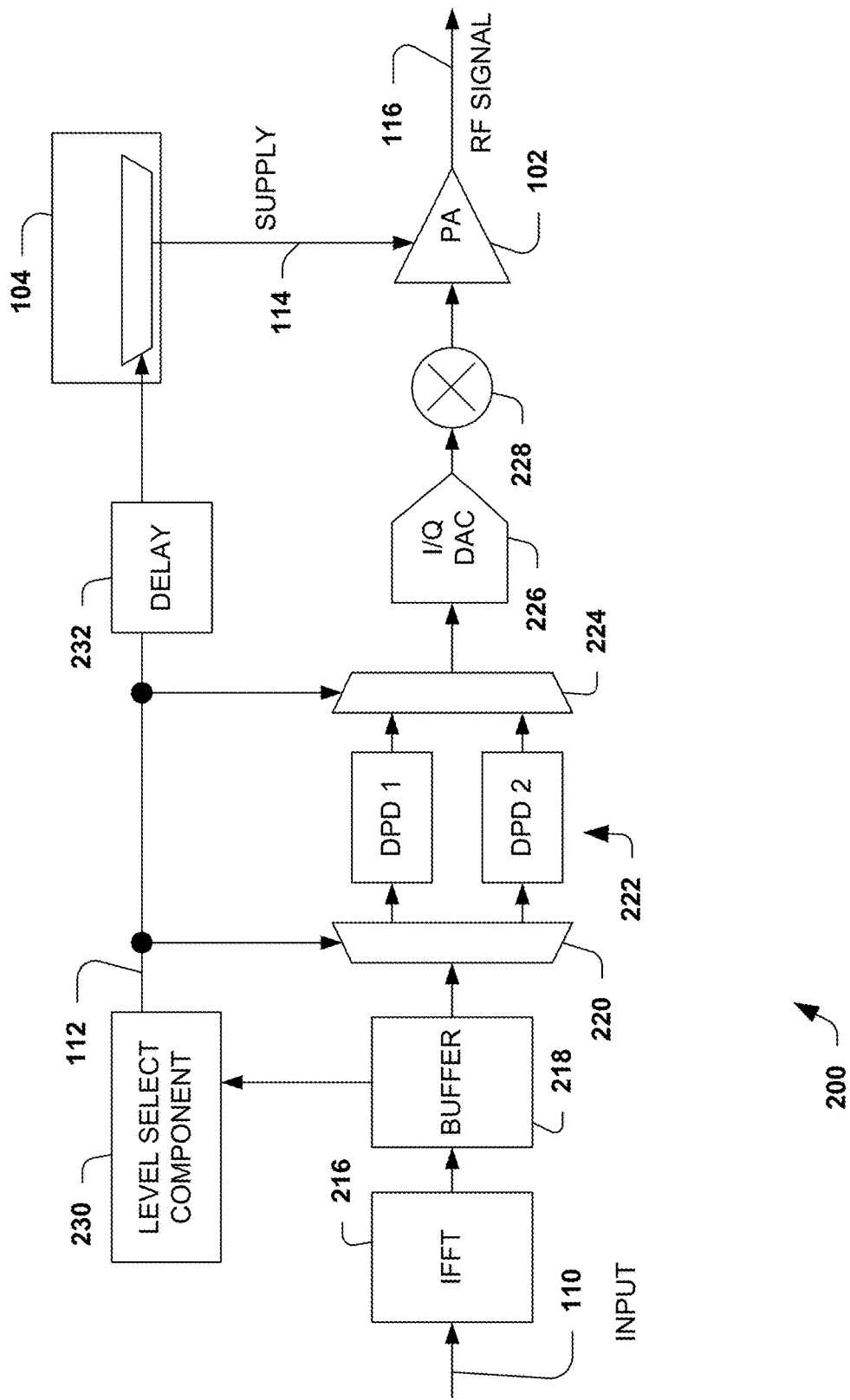
FIG. 2 is a diagram illustrating an envelope tracking (ET) power amplifier (PA) arrangement.

FIG. 2 is a diagram illustrating an envelope tracking (ET) power amplifier (PA) arrangement 200. The arrangement 200 is similar to the arrangement 100. However, the arrangement 200 is provide with additional details. The arrangement 200 utilizes two or more levels for a supply voltage used to power a power amplifier. The levels are selected based on envelope information of an input signal.

The arrangement 200 is described with two supply voltage levels or chunk levels, VCC1 and VCC2 for illustrative purposes. However it is appreciated that the arrangement 200 can utilize additional supply voltage levels.

The arrangement 200 includes an IFFT component 216, a buffer 218, a first multiplexer 220, digital pre-distortion (DPD) components 222, a second multiplexer 224, an I/O DAC 226, a mixer 228, a power amplifier 102, an envelope tracking (ET) level select component 230, a delay component 232 and an ET supply 104.

The IFFT (inverse fast Fourier transform) component 216 is configured to convert symbols of the input signal 110 from a frequency domain to a time domain. The IFFT component 216 is utilized for orthogonal frequency division multiplexing (OFDM) modulation. It is appreciated that alternative components can be utilized for other types of modulation.

The buffer 218 at least temporarily stores or maintains symbols to be transmitted of the input signal 110. The buffer 218 is configured to provide the symbols to the first multiplexer 220 and the level select component 230. The buffer 218 can isolate components, including the level select component 230 from the input signal and mitigate its impact on the input signal. The output of the buffer 218 can be driven higher.

The level select component 230 is configured to select a chunk length, select a chunk level for each chunk, and to determine a switching time between chunks. The level select component 230 is configured to segment the signal 110 and the symbols into chunks based on time, the selected chunk length. The chunk length can be, for example, 20-200 nano-seconds (ns), in one example. Other chunk times or lengths are contemplated. It is also noted that the chunk length can be constant over a number of chunks and/or varied so that different chucks can have different chunk lengths or times.

As stated above, the component 230 is configured to determine a chunk level for each chunk. In this example, the chunk level is one of VCC1 or VCC2. In one example, VCC1 is at a higher voltage, such as 3 Volts and VCC2 is at a lower voltage, such as 1.5 Volts. In another example, VCC1 is at 1.8 Volts and VCC2 is at 0.9 Volts. The chunk level is determined based on the input signal 110 and is substantially constant per chunk and over the chunk length. In one example, the chunk level is based on envelope tracking information of the input signal 110. In another example, the chunk level is determined according to an actual signal peak value for the chunk, where the envelope tracking information includes the actual signal peak value. Other suitable techniques can be used to determine the chunk level. The chunk levels are provided as a levels signal 112.

One example technique for selecting a chunk level is by finding a peak amplitude value for each chunk and selecting the chunk level by comparing the peak amplitude to a threshold value. An example of doing so is described below with regard to FIG. 3. For more than two chunk levels, a plurality of threshold values can be used. It is noted that the threshold values can be adjusted dynamically by the component 230 during operation to facilitate power savings. In another example, the threshold values are predetermined.

Another technique for selecting a chunk level is to determine a chunk level that satisfies an allowed distortion or distortion level for the chunk of the input signal 110. The allowed distortion can be based on a mask distortion; an error, vector, magnitude (EVM) and the like.

The component 230 is configured to select the switching interval between chunks based on the input signal 110. In one example, the switching interval is selected based on samples having an amplitude below a threshold value for a duration longer than a switching threshold. In one example, the switching threshold is an amount of time for the supply 104 to switch from one chunk level to another.

The DPD components 222 generate and apply pre-distortions to the symbols or signal from the buffer 218. The pre-distortions are at least partially based on the chunk levels of the levels signal 112. The first multiplexer 220 receives the signal 110 and selects a path to DPD 1 or DPD 2 based on the levels signal 112. The DPD 1 is a DPD using VCC1 and the DPD 2 is a DPD using VCC2. It is appreciated that additional DPDs can be used for additional supply voltage levels.

The DPD 1 or DPD 2 apply a pre-distortion to the buffered input signal/symbols to generate a pre-distorted signal. The pre-distorted signal is directed to the I/O DAC 226 by the second multiplexer 224. The second multiplexer 224 is configured to select a path from DPD 1 or DPD 2 based on the levels signal 112.

The DPD components 222, which include DPD 1 and DPD 2, are specific to a discrete level or chunk level. The DPDs 222 can include lookup table(s) (not shown) to identify distortions. The lookup tables are specific to an associated level, such as VCC1 or VCC2. In one example, a single lookup table is used by the DPDs where entries are at least partially based or indexed on the chunk levels. The DPD components 222 are shown with DPD 1 and DPD 2 in this example. However, it is appreciated that varied numbers of DPD components and/or alternate techniques of generating and applying pre-distortions based on the chunk levels can be utilized.

The I/O DAC 226 includes one or more blocks for processing the pre-distorted signal including, but not limited to a digital to analog converter (DAC), an in phase (I) quadrature (Q) mixer, baseband filter and the like. The DAC 226 is configured to process the pre-distorted signal and provide the signal to a mixer 228.

The mixer 228 is configured to mix the analog signal from the DAC at a selected frequency. The mixed signal is provided to the PA 102 for amplification.

The delay component 232 is configured to delay the levels signal 112 by a path delay. The delayed signal is provided to the supply 104. The path delay is associated with a path delay from the buffer component 218 through the DPDs 222 to an input of the PA 102.

The supply 104 is configured to selectively apply a supply voltage 114 to the PA 102 according to the delayed levels signal from the delay component 230. The supply voltage 114 is applied at a chunk level, VCC1 or VCC2, associated with a chunk of the RF signal. The PA 102 operates at a mode according to or associated with the chunk level for the RF signal chunk.

The supply 104, in this example, is configured to generate VCC1 and VCC2. The supply 104 includes a supply multiplexer configured to provide one of the VCC1 and VCC2 as the supply voltage 114 to the PA 102. The supply 104 can include one or more direct current (DC) to DC converters, voltage regulators, low dropout (LDO) voltage regulators and the like.

The supply 104 can include multiple supplies configured to provide voltages at the chunk levels and the, one of the multiple supplies is selected based on the current chunk level using a switch or array of switches. In another example, the supply 104 includes a single supply configured to provide a plurality of voltage levels associated with the chunk levels.

The PA 102 operates in a mode based on the chunk level and is configured to generate an output RF signal 116 based on the input signal or RF signal from the RF block 106. The PA 102 is powered by the supply voltage from the chunk supply 104.

The level select component 230 is configured to determine or select a switching time from one voltage level of the supply 104 to another voltage level. The switching time includes a period of time or interval between switching the supply voltage 114 from one chunk level to another chunk level. This switching generally occurs at a low level of the input signal. The interval is typically less than the period of time for a chunk of the input signal. The addition of noise due to switching the supply voltage 114 is mitigated because the switching occurs at relatively low amplitudes. Thus, the impact of the switching on the EVM, mask, spurs and the like is mitigated.

The RF signal 116 can be transmitted using one or more antenna, which are not shown. It is also appreciated that filtering and/or other processing can be performed on the RF signal 116.

The arrangement 200 and the generated RF signal 116 can be generated for wide channels, including channels wider than 20-40 MHz. The wide channels can also WiFi 802.11ac (channels up to 160 MHz), Long Term Evolution (LTE) Advanced (channels up to 100 MHz), ultra wideband applications, and the like.

Figure 3:
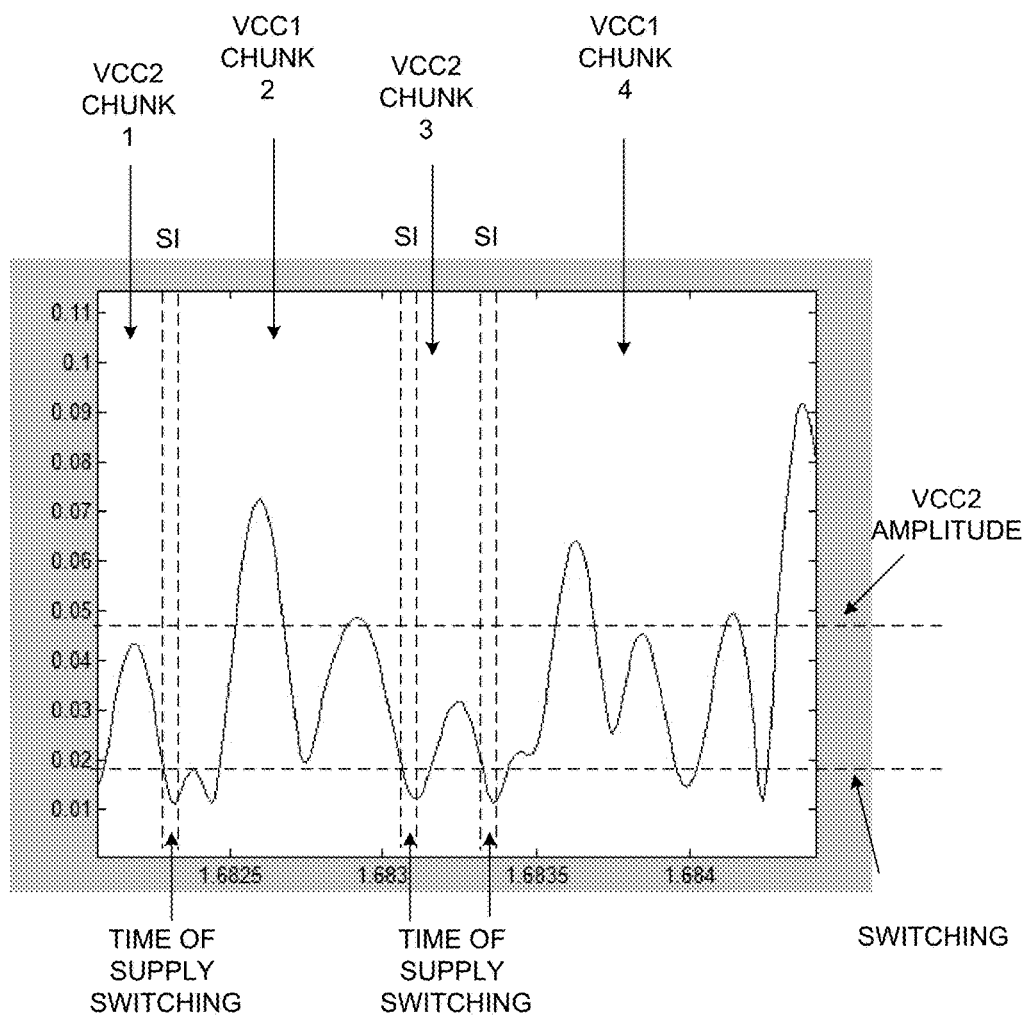
FIG. 3 is a graph illustrating utilizing varied supply levels for a supply voltage.

FIG. 3 is a graph 300 illustrating utilizing varied supply levels for a supply voltage. The varied levels or chunk levels are used as a supply voltage for a power amplifier, typically as part of a transmission chain. The levels and values shown are for illustrative purposes and it is appreciated that other values are contemplated.

The graph 300 depicts an input signal over time along an x-axis and amplitude in volts along a y-axis. The time is in nano seconds. The graph 300 can be derived using the arrangement 100, 200 and/or variations thereof. The component 230 or component 108 can be utilized to analyze the input signal, segment the signal into chunks and assign chunk levels.

This example is shown with two chunk levels, VCC1 and VCC2. VCC1 is greater than VCC2. It is appreciated that additional chunk levels can be utilized. The input signal is segmented into chunks with supply intervals between the chunks.

The graph 300 shows threshold levels for determining a chunk level as horizontal dashed lines. A first level, shown as VCC2 amplitude, is a level at and below that the VCC2 is sufficient or suitable for the chunk. Above, the VCC2 amplitude level, VCC1 is selected as the chunk level. Thus, if a peak value within the chunk is greater than the first level (VCC2 amplitude), the VCC1 is used. Otherwise, VCC2 is used. Switching intervals (SI) are shown between chunk levels or chunks wherein the supply for the PA is switching from one level to a next level, such as from VCC1 to VCC2 or VCC2 to VCC1. The switching intervals generally have low amplitudes for the duration of the SI, thus the SI can mitigate out of channel distortions, such as mask distortions and the like.

A second level designated as SWITCHING indicates suitable times or intervals to switch between chunks. The second level is also referred to as a switching level. In one example, the component 230 is configured to segment chunks based on the input signal falling below the second level.

A first chunk of the input signal has a single peak that is below the first level. Thus, the VCC2 is suitable to support this chunk. A first switching interval (SI) is identified where the input signal falls below the second level.

A second chunk of the input signal has second and third peaks that are above the first level threshold value. As a result, VCC2 is insufficient for this chunk. Thus, VCC1 is assigned as the chunk level. A second SI is identified after the input signal again falls below the second level.

A third chunk of the input signal has a single peak that is below the first level. As a result, the VCC2 is assigned as the chunk level for the third chunk. A third SI is identified as the input signal falls below the second level.

A fourth chunk has three peaks that rise above the first level. Thus, the VCC1 is assigned as the chunk level.

In this example, chunks of the signal are determined by identifying switching intervals. Then, each chunk is assigned a chunk level based on its highest peak. Chunks may vary in time duration.

Figure 4:
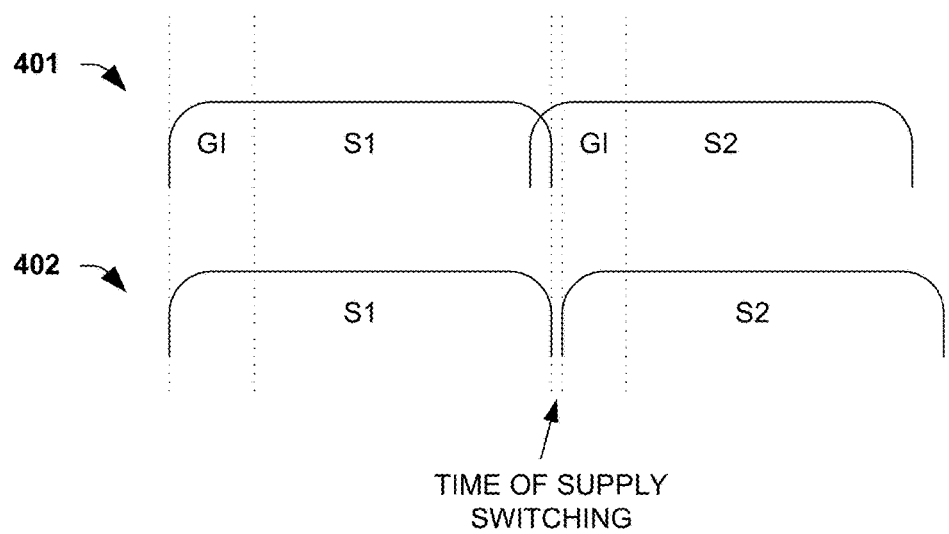
FIG. 4 is a diagram illustrating identifying chunks of an input signal using symbols.

FIG. 4 is a diagram illustrating identifying chunks of an input signal using symbols. The diagram is provided for illustrative purposes and it is appreciated that other symbols and variations thereof are contemplated.

The diagram is described in conjunction with the arrangements 100 and 200, described above.

In this example, chunk lengths are based on symbol duration, such as orthogonal frequency division multiplexing (OFDM) symbol duration. The chunk length can be an orthogonality time of OFDM modulation used for the OFDM symbol. A modified windowing can be used to get a low amplitude for a duration of a selected switching time.

A first example 401 depicts a first symbol S1 followed by a second symbol S2, both of an input signal. The symbols S1 and S2 overlap slightly. Guard intervals (GIs) are shown that account for possible overlap. In this example, each symbol is defined as a chunk of the input signal. A switching interval (SI) is determined using the GIs. The SI, in this example, is at least a portion of the GI. A chunk level for the S1 can be determined by identifying peaks for the S1 and comparing the peaks with threshold values. Similarly, a chunk level for the S2 can be determined by identifying peaks for the S2 and comparing the peaks with threshold values.

A second example 402 depicts a first symbol S1 followed by a second symbol S2, both of an input signal with a modified windowing that is used to get a low amplitude for a duration of a selected switching time. The symbols S1 and S2 have a gap there between. Guard intervals (GIs) are shown that account for possible overlap. In this example, each symbol is defined as a chunk of the input signal. A switching interval (SI) is determined using the GIs. The SI, in this example, is at least a portion of the GI. It is noted that the low amplitude for the duration of the switching interval can mitigate out of channel distortions, such as mask distortions and the like.

It is appreciated that other suitable techniques for identifying chunks and assigning chunk levels for the chunks are contemplated.

Figure 5:
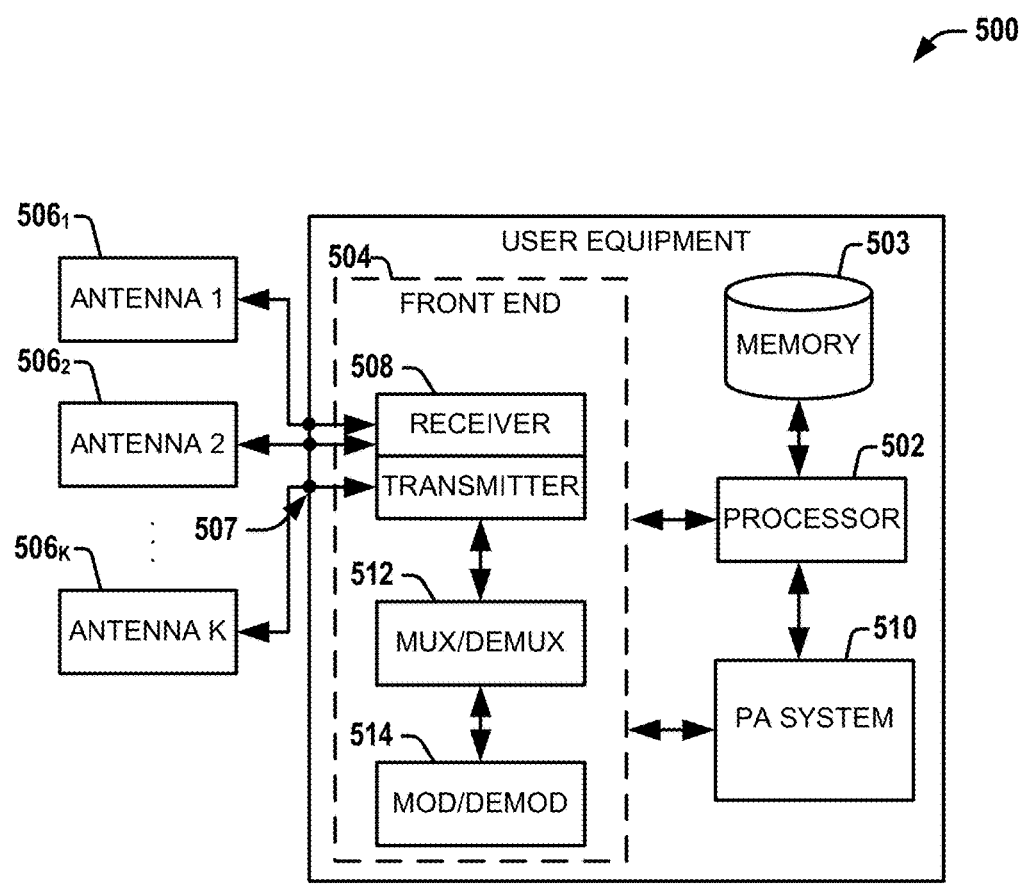
FIG. 5 is a diagram illustrating an exemplary user equipment or mobile communication device.

FIG. 5 is a diagram illustrating an exemplary user equipment, vehicle user equipment or mobile communication device 500 that can be utilized with one or more aspects, arrangements and/or embodiments described above.

The mobile communication device 500, for example, comprises a digital baseband processor 502 that can be coupled to a data store or memory 503, a front end 504 (e.g., an RF front end, an acoustic front end, or the other like front end) and a plurality of antenna ports 507 for connecting to a plurality of antennas $506_1$ to $506_k$ (k being a positive integer). The antennas $506_1$ to $506_k$ can receive and transmit signals to and from one or more wireless devices such as access points, access terminals, wireless ports, routers and the like, which can operate within a radio access network or other communication network generated via a network device. The user equipment 500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, TV broadcast stations, radio broadcast stations, satellite communication, backbone RF transmitters, wearable device, base station or a like device that can operate to communicate with a network or other device according to one or more different communication protocols or standards.

The front end 504 can include a communication platform, which comprises electronic components and associated circuitry that provide for processing, manipulation or shaping of the received or transmitted signals via one or more receivers or transmitters 508, a mux/demux component 512, and a mod/demod component 514. The one or more transmitters 508 are configure to use PLL arrangement, which facilitates generation of the transmitted signals.

The front end 504, for example, is coupled to the digital baseband processor 502 and the set of antenna ports 507, in which the set of antennas $506_1$ to $506_k$ can be part of the front end.

The user equipment device 500 can also include a processor 502 or a controller that can operate to provide or control one or more components of the mobile device 500. For example, the processor 502 can confer functionality, at least in part, to substantially any electronic component within the mobile communication device 500, in accordance with aspects of the disclosure.

The processor 502 can operate to enable the mobile communication device 500 to process data (e.g., symbols, bits, or chips) for multiplexing/demultiplexing with the mux/demux component 512, or modulation/demodulation via the mod/demod component 514, such as implementing direct and inverse fast Fourier transforms, selection of modulation rates, selection of data packet formats, inter-packet times, etc. Memory 503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 502 is functionally and/or communicatively coupled (e.g., through a memory bus) to memory 503 in order to store or retrieve information necessary to operate and confer functionality, at least in part, to communication platform or front end 504, the power amplifier (PA) system 510 and substantially any other operational aspects of the PA system 510.

Figure 6:
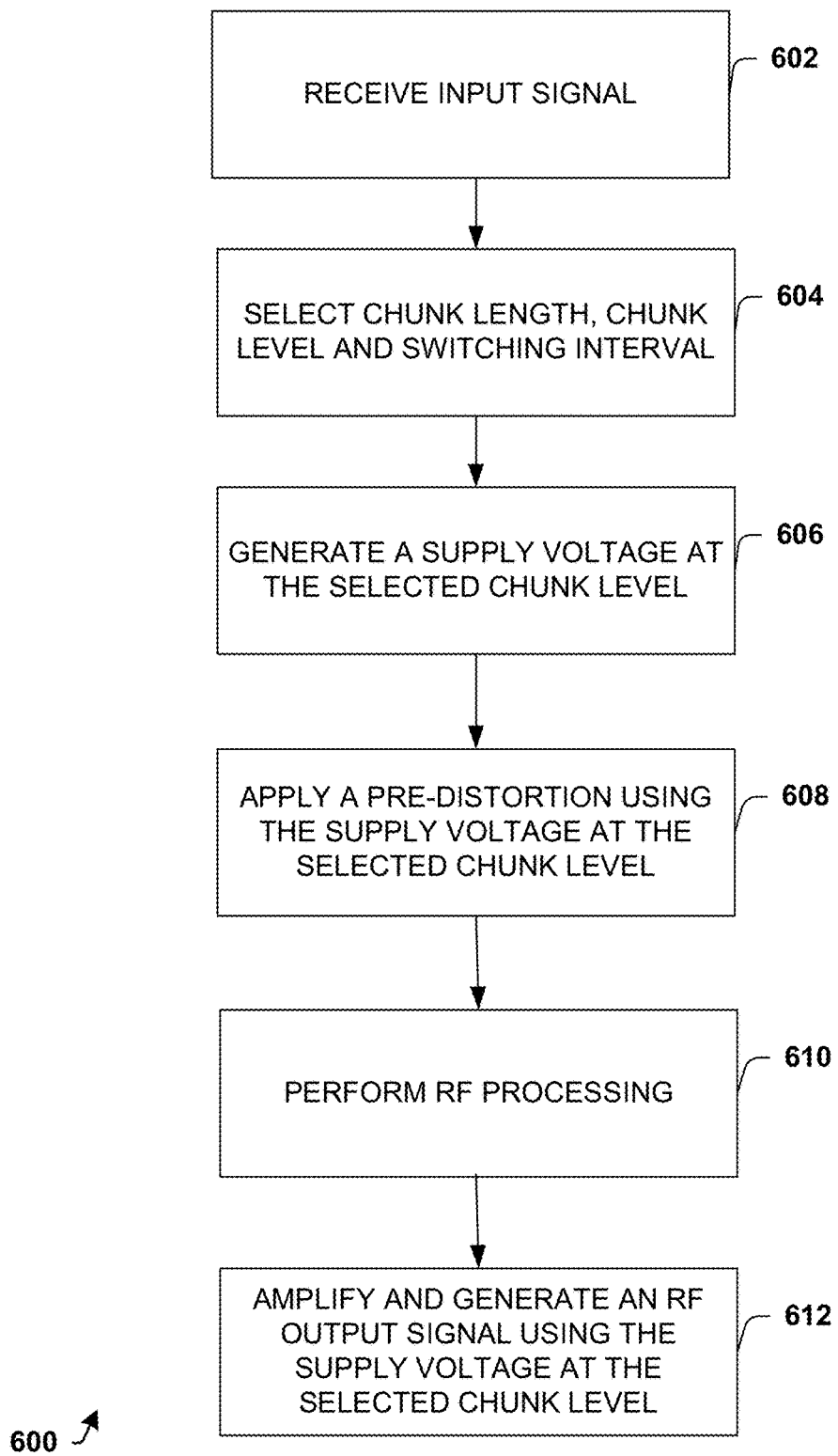
FIG. 6 is a flow diagram illustrating a method of operating an envelope tracking arrangement.

FIG. 6 is a flow diagram illustrating a method 600 of operating an envelope tracking arrangement. The method 600 can be used within a transceiver or transmitter for communication purposes and/or other applications. The method 600 utilizes discrete power levels as a supply voltage to a power amplifier, which can mitigate noise and power consumption and facilitate wide channels.

The above systems, devices, arrangements and the like can be referenced and used with or in conjunction with the method 600. For example, the arrangements 100, 200 and variations thereof can be utilized to perform the method 600.

It is appreciated that the method 600 can be repeated at regular or irregular intervals.

An input signal is received by a buffer at block 602. The input signal can include baseband information and/or baseband signals. The input signal can also include codings and/or modulations, such as OFDM. The input signal can also utilize symbols, such as OFDM symbols. The input signal can be processed by an inverse fast Fourier transform (IFFT) component configured to convert symbols of the input signal from a frequency domain to a time domain.

The buffer at least temporarily stores or maintains the symbols and/or the input signal. The buffer can isolate components from the input signal to mitigate their impact on the input signal. An example of a buffer is shown above with regard to FIG. 2.

A level select component selects a chunk length, a chunk level and a switching interval/time based on the input signal at block 604. The input signal is provided to the level select component by the buffer, however it is appreciated that other techniques for providing the input signal to the level select component can be utilized. The input signal is segmented into a plurality of chunks having chunk lengths. The chunk length can vary for other chunks of the input signal.

The chunk level is one of a plurality of voltage levels that can be used as a supply voltage. In one example, as shown above, there are two chunk levels, VCC1 and VCC2. In other examples, there are more than two chunk levels. In one example, the chunk level is substantially constant for the chunk duration or chunk length. In another example, the chunk level varies over time for the chunk duration or length.

The chunk level is selected or determined based on information of the input signal, an allowed distortion, and the like. The information can include envelope tracking information, amplitude information, peak value information and the like. In one example, peak values are compared with one or more threshold values. Other examples of suitable techniques for selecting the chunk level are provided above.

The chunk length is also selected based on the input signal. In one example, the chunk length is based on a symbol length. In another example, the chunk length is based on amplitude values of the input signal.

The switching interval is also selected based on the input signal. In one example, the switching interval is determined by identifying a period of time where an amplitude of the input signal is below a threshold value for a period of time. The period of time can include the time it takes to switch a supply voltage from one chunk level to another.

A supply component generates a supply voltage at the selected chunk level at block 606. Operation of the supply component at selected chunk levels are also referred to as modes. In one example, an array of switches is used to select the supply voltage from a plurality of voltage sources, such as direct current to direct current converters. In another example, a multiplexor is used to select one source from a plurality of voltage sources to provide the supply voltage. In yet another example, the supply component utilizes a programmable direct current to direct current (DC2DC) converter that is configured to switch between supply voltage levels relatively quickly, for example, based on a received control signal. It is appreciated that other suitable techniques are contemplated.

A digital pre-distortion (DPD) component applies a pre-distortion to the input signal at block 608 using the supply voltage at the selected chunk level. The predistortion component can include a plurality of individual digital predistortion (DPD) components. In one example, the DPD component includes a first multiplexer, a plurality of DPDs and a second multiplexer, as shown in FIG. 2. It is appreciated that other configurations for the predistortion component are contemplated.

Radio frequency (RF) processing is performed on the input signal at block 610 to generate an RF signal for amplification. The RF processing includes generating in phase (I) components, quadrature (Q) components, digital to analog conversion (DAC), mixing, a polar modulator, and the like. The RF signal includes chunks that correlate to chunks of the input signal.

A power amplifier (PA) amplifies the RF signal at block 612 using the supply voltage at the selected chunk level to generate an RF output signal. The supply voltage is at the selected chunk level so that the selected chunk level is used for the duration of the chunk of the RF signal. The RF output signal can be transmitted using one or more antenna and then received by a receiver and/or transceiver.

The PA has a selected gain and typically has non linearity that is at least partially corrected for by the DPD component.

Unlike other approaches, the PA is not required to track a signal amplitude. Further, the supply voltage generation is simplified for the discrete voltages of the plurality of chunk levels instead of supplying any voltage throughout a range.

The RF output signal generated by the arrangement can utilize a relatively wide channel. Some examples of relatively wide channels include channels wider than 20-40 MHz, 160 MHz, WiFi 802.11ac channels, LTE advanced channels (100 MHz), ultra wideband (>500 MHz), and the like.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

Examples may include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an envelope tracking arrangement. The arrangement includes a level select component, a chunk supply component and a power amplifier. The level select component is configured to segment an input signal into chunks based on time, select a chunk level for each chunk based on information or envelope information and select a switching interval. The chunk supply component is configured to selectively provide a discrete supply voltage according to the selected chunk level. The power amplifier is configured to generate a radio frequency (RF) output signal based on the input signal and utilizing the discrete supply voltage.

Example 2 includes the subject matter of Example 1, including or omitting optional elements, where the arrangement further includes an RF block configured to process the input signal.

Example 3 includes the subject matter of any of Examples 1-2, including or omitting optional elements, where the chunk supply component comprises a plurality of voltage sources at a plurality of voltages and connected to an output of the chunk supply component by a plurality of switches, wherein the plurality of switches are configured to provide the selected chunk level as the supply voltage.

Example 4 includes the subject matter of any of Examples 1-3, including or omitting optional elements, where the level select component is configured to select the switching interval based on the input signal and properties of the chunk supply component.

Example 5 includes the subject matter of any of Examples 1-4, including or omitting optional elements, where the level select component is configured to select a chunk length based on an orthogonal frequency division multiplexing (OFDM) symbol, where the chunk length is an orthogonality time of OFDM modulation used for the OFDM symbol and the switching time occurs within guard intervals.

Example 6 includes the subject matter of any of Examples 1-5, including or omitting optional elements, where the level select component is configured to select the chunk level based on amplitude information of the input signal.

Example 7 includes the subject matter of any of Examples 1-6, including or omitting optional elements, where the level select component is configured to select the chunk level by comparing peak amplitude information with one or more threshold values.

Example 8 includes the subject matter of any of Examples 1-7, including or omitting optional elements, where the level select component is configured to select the chunk level based on a noise threshold.

Example 9 includes the subject matter of any of Examples 1-8, including or omitting optional elements, further comprising a buffer configured to buffer the input signal and provide the input signal to the level select component.

Example 10 includes the subject matter of any of Examples 1-9, including or omitting optional elements, further comprising a digital pre-distortion (DPD) component configured to apply a predistortion to the input signal using the selected chunk level.

Example 11 includes the subject matter of any of Examples 1-10, including or omitting optional elements, where the input signal utilizes amplitude modulation.

Example 12 is an envelope tracking arrangement having a level select component, a digital pre-distortion (DPD) component, a mixer and a power amplifier. The level select component is configured to select a chunk length and a chunk level for a chunk of an input signal. The digital pre-distortion (DPD) component is configured to apply a distortion to the input signal from the buffer using the selected chunk level to generate a pre-distorted signal. The mixer is configured to mix the pre-distorted signal at a selected frequency to generate a mixed signal. The power amplifier configured to generate a radio frequency (RF) output signal based on the mixed signal using a supply voltage at the selected chunk level for a discrete period of time, wherein the discrete period of time is the selected chunk length.

Example 13 includes the subject matter of Example 12, including or omitting optional elements, where the arrangement further includes a supply component configured to provide the supply voltage at the selected chunk level.

Example 14 includes the subject matter of any of Examples 12-13, including or omitting optional elements, further comprising a delay element configured to delay communication of the selected chunk level to the supply component by a path delay.

Example 15 includes the subject matter of any of Examples 12-14, including or omitting optional elements, further comprising an inverse fast Fourier transform (IFFT) component configured to obtain symbols from the input signal and provide the symbols to the buffer.

Example 16 includes the subject matter of any of Examples 12-15, including or omitting optional elements, where the DPD component includes a plurality of digital pre-distorters associated with varied voltages.

Example 17 includes the subject matter of any of Examples 12-16, including or omitting optional elements, where the selected chunk level is one of a plurality of chunk levels.

Example 18 is a method of performing envelope tracking using discrete levels. The method includes selecting a chunk level and a chunk length based on an input signal by a level select component, generating a supply voltage at the selected chunk level for duration specified by the chunk length and generating a radio frequency (RF) output signal based on the input signal using the supply voltage.

Example 19 includes the subject matter of any of Examples 12-16, including or omitting optional elements, further comprising applying a pre-distortion to the input signal by a digital pre-distortion (DPD) component using the selected chunk level.

Example 20 includes the subject matter of any of Examples 12-16, including or omitting optional elements, where selecting the chunk level comprises comparing peak amplitude values with one or more threshold values.

Example 21 is an envelope tracking arrangement. The arrangement includes a means to segment an input signal into chunks based on time, a means to select a chunk level for each chunk based on envelope information, a means to select a switching interval, a means to selectively provide a discrete supply voltage according to the selected chunk level and the selected switching interval and a means to generate a radio frequency (RF) output signal based on the input signal and utilizing the discrete supply voltage.

Example 22 is an envelope tracking arrangement. The arrangement includes a means to select a chunk level and a chunk length based on an input signal, a means to generate a supply voltage at the selected chunk level for duration specified by the chunk length, a means to generate a radio frequency (RF) output signal based on the input signal using the supply voltage and a means to apply a pre-distortion to the input signal by a digital pre-distortion (DPD) component using the selected chunk level.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well.

Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. The component or structure includes a processor executing instructions in order to perform at least portions of the various functions. In addition, while a particular feature of the invention may have been disclosed with respect to only one of several implementations, such feature may be combined with one or more other features of the other implementations as may be desired and advantageous for any given or particular application.

Furthermore, to the extent that the terms "including", "includes", "having", "has", "with", or variants thereof are used in either the detailed description and the claims, such terms are intended to be inclusive in a manner similar to the term "comprising".

What is claimed is:

1. An envelope tracking arrangement comprising:
    a level select component configured to select a chunk length and a chunk level for a chunk of an input signal;
    a digital pre-distortion (DPD) component configured to apply a distortion to the input signal using the selected chunk level to generate a pre-distorted signal;
    a mixer configured to mix the pre-distorted signal at a selected frequency to generate a mixed signal; and
    a power amplifier configured to generate a radio frequency (RF) output signal based on the mixed signal using a supply voltage at the selected chunk level for a discrete period of time, wherein the discrete period of time is the selected chunk length.

2. The arrangement of claim 1, further comprising a supply component configured to provide the supply voltage at the selected chunk level.

3. The arrangement of claim 2, further comprising a delay element configured to delay communication of the selected chunk level to the supply component by a path delay.

4. The arrangement of claim 1, further comprising an inverse fast Fourier transform (IFFT) component configured to obtain symbols from the input signal.

5. The arrangement of claim 1, wherein the DPD component includes a plurality of digital pre-distorters associated with varied voltages.

6. The arrangement of claim 1, wherein the selected chunk level is one of a plurality of chunk levels.

* * * * *